United States Patent [19]

Mote, Jr.

[11] Patent Number: 5,537,062

[45] Date of Patent: Jul. 16, 1996

[54] GLITCH-FREE CLOCK ENABLE CIRCUIT

[75] Inventor: L. Randall Mote, Jr., Laguna Hills, Calif.

[73] Assignee: AST Research, Inc., Irvine, Calif.

[21] Appl. No.: 485,477

[22] Filed: Jun. 7, 1995

[51] Int. Cl.⁶ .................................................. H03K 19/096
[52] U.S. Cl. ................................................ 326/93; 327/141
[58] Field of Search ................................ 326/93, 95, 98; 327/141

[56] References Cited

U.S. PATENT DOCUMENTS

| | | | |
|---|---|---|---|
| 4,105,980 | 8/1978 | Cowardin et al. | 327/170 |
| 5,083,049 | 1/1992 | Kagey | 327/141 |
| 5,315,181 | 5/1994 | Schowe | 326/93 |
| 5,379,325 | 1/1995 | Katayama et al. | 326/93 |
| 5,387,825 | 2/1995 | Cantrell et al. | 326/93 |
| 5,388,225 | 2/1995 | Cantrell et al. | 326/93 |

*Primary Examiner*—Edward P. Westin
*Assistant Examiner*—Benjamin D. Driscoll
*Attorney, Agent, or Firm*—Knobbe, Martens, Olson & Bear

[57] ABSTRACT

A circuit utilizes a toggle flip-flop, a D flip-flop and combinatorial logic to generate a clock signal which can be enabled or disabled without creating spikes or shortened pulses in the clock signal. The circuit receives an input clock signal and an input clock enable signal. The circuit generates an output clock signal which is an enabled/disabled version of the input clock signal, controlled by the input clock enable signal. The circuit thus provides the operational advantages of enabling or disabling, with a single control signal, groups of logic circuits triggered by a common clock signal.

3 Claims, 5 Drawing Sheets

PRIOR ART

FIG. 1

PRIOR ART

FIG. 2

PRIOR ART

FIG. 3

PRIOR ART

GLITCH-FREE CLOCK ENABLE CIRCUIT

BACKGROUND OF THE INVENTION

1. Field of the Invention

The present invention is in the field of digital logic circuits.

2. Description of the Related Art

Generally, digital logic systems operate on a synchronous basis. That is, the circuits within the digital logic system are responsive to a common "clock" signal such that output signals generated by a first logic circuit within the system change at predictable times with respect to the clock signal. Thus, a second logic circuit receiving an output signal from the first logic circuit can gate the output signal at a particular time with respect to the clock signal. In this manner, it is assured that the output signal is stable, e.g., has reached one of two binary states and has been at that state for a sufficient amount of time that the second logic circuit will detect the correct state.

It may be advantageous to selectively disable a number of circuits within a digital logic system for a specific time period. One method of accomplishing this would be to gate on and gate off the common clock input to a group of synchronous circuits using a control signal. For example, the clocking of bits through a shift register comprising a number of interconnected bistable components could be controlled by selectively disabling the clock inputs to each of these bistable components. A gating function accomplished by, for example, "ANDing" the clock with a "disable" signal such that when the disable signal is asserted the clock signal does not pass through to the gate output, however, may generate "glitches" in the clock signal, particularly if there is any uncertainty as to the times at which the disable signal changes with respect to the clock signals. This condition can especially arise when the enable signal is synchronously generated with respect to the clock to be gated. These glitches occur when the disable signal is asserted shortly after the rising or falling edges of the clock, resulting in narrowed clock pulses or possibly even "spikes" which can cause malfunctions in the clocked logic circuits. Thus, a need exists for a logic circuit that provides the benefits of a clock which can be enabled and disabled without generating such glitches.

SUMMARY OF THE INVENTION

The present invention provides a clock enabling circuit which receives an input clock signal and which receives an input clock enable signal synchronized to the input clock signal, and which generates an enabled clock output signal which is active when the clock enable signal is asserted and inactive when the clock enable signal is not asserted. The circuit comprises a toggle flip-flop having as inputs the input clock enable signal and the input clock signal, and having an output which changes states upon occurrence of a rising edge of the input clock signal only when the input clock enable signal is asserted. The circuit also comprises a D flip-flop which has as inputs the input clock signal and the toggle flip-flop output. The D flip-flop has an output which changes to the state of the toggle flip-flop output upon occurrence of a falling edge of the input clock signal. The circuit further comprises a combinatorial logic circuit having as inputs the toggle and D flip-flop outputs. The combinatorial logic circuit generates an output which is functionally the exclusive-OR of these flip-flop outputs and which is the enabled clock output signal of the clock enabling circuit.

DETAILED DESCRIPTION OF THE INVENTION

Figure 1:
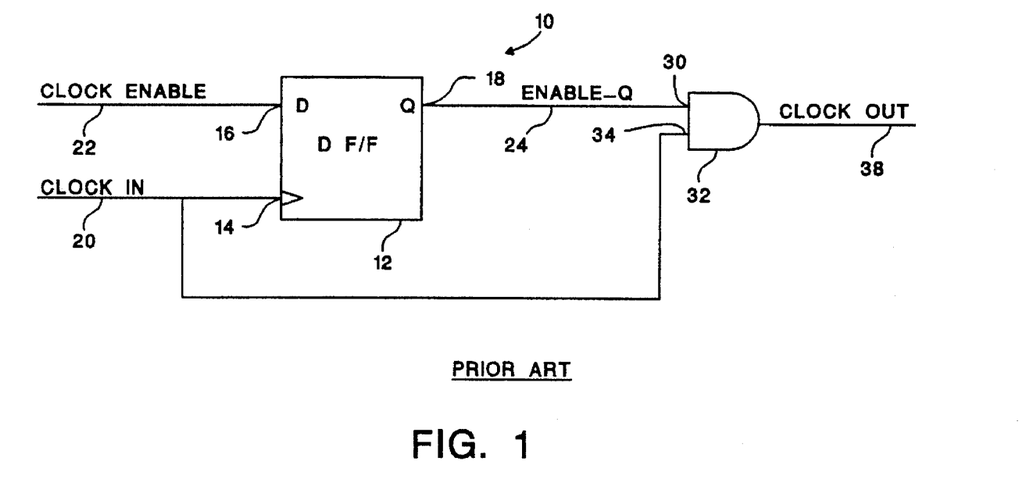
FIG. 1 illustrates a logic diagram of an exemplary prior art clock enable circuit having a potential glitch on the clock output.

FIG. 1 illustrates a logic diagram of an exemplary prior art clock enable circuit 10 having the problem solved by the present invention. As illustrated, the circuit 10 includes a D flip-flop 12 having a clock input 14, a data input (D) 16 and an output (Q) 18. The clock input 14 receives a CLOCK IN signal on a signal line 20. The D input 16 receives a CLOCK ENABLE input on a signal line 22. The D flip-flop 12 generates an ENABLE_Q signal on the Q output 18 which is provided via a signal line 24 to a first input 30 of a two-input AND gate 32. A second input 34 of the two-input AND gate 32 is connected to receive the CLOCK IN signal on the signal line 20. The AND gate 32 has an output 36 which provides a CLOCK OUT signal on a signal line 38.

Figure 2:
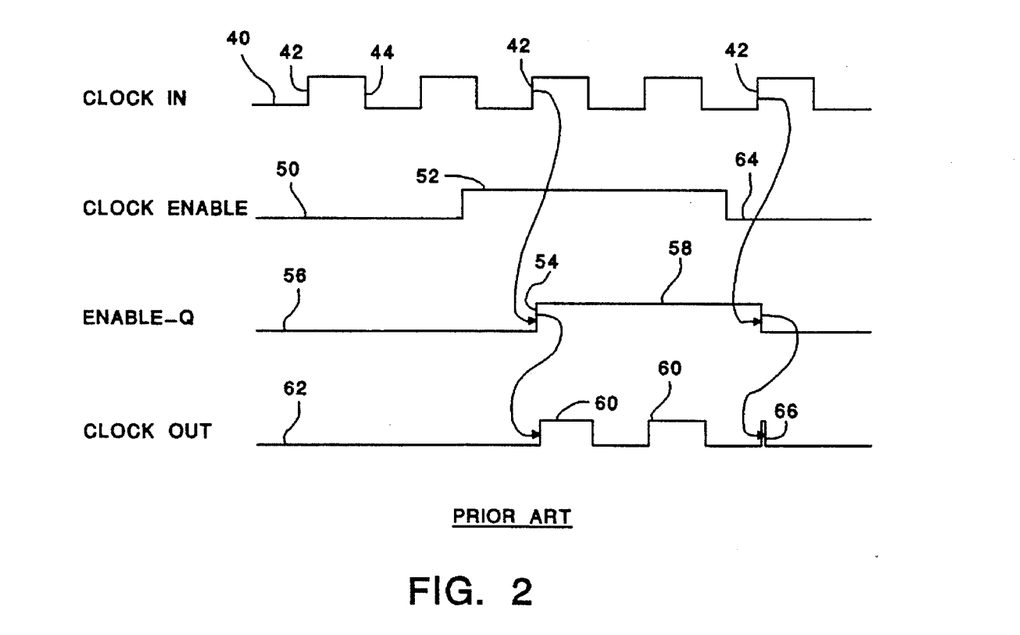
FIG. 2 illustrates timing diagrams of signals associated with the prior art clock enable circuit showing the glitch on the clock output signal.

As illustrated by a CLOCK IN timing diagram 40 in FIG. 2, the CLOCK IN signal comprises a plurality of clock pulses defined by rising edges 42 and falling edges 42. The D flip-flop 12 of FIG. 1 is responsive to the rising edges 42 to transfer the state of the CLOCK ENABLE signal on the D input 16 to the Q output 18. Thus, as illustrated by a CLOCK ENABLE timing diagram 50 in FIG. 2, when the CLOCK ENABLE signal is active, as indicated by a high signal level 52, the high signal level will be clocked into the D flip-flop 12 on occurrence of one of the rising edges 42 and will appear at the Q output 18, as illustrated by a rising edge 54 of an ENABLE_Q timing diagram 56.

While the ENABLE_Q signal is at a high level 58, the AND gate 32 will provide clock pulses on the CLOCK OUT signal line 38, as illustrated by clock pulses 60 in a timing diagram 62 in FIG. 2. When the CLOCK ENABLE signal switches to its inactive state (e.g., low) as illustrated at 64 in the timing diagram 50, the ENABLE_Q signal will become inactive on the next occurrence of one of the rising edges 42 of the CLOCK IN signal. However, because of the propagation delay in the D flip-flop 12, the ENABLE_Q signal will remain active high for a short amount of time after the CLOCK IN signal switches to its high state. The concurrence of the active high ENABLE_Q signal and the active high CLOCK IN signal at the first and second inputs 30, 34 of the AND gate 32 will result in a short pulse or "glitch" 66 of the CLOCK OUT signal. This glitch can be detected by circuitry which receives the CLOCK OUT signal and may cause unpredictable results in the operation of an integrated circuit into which the clock enable circuit 10 is incorporated.

Figure 3:
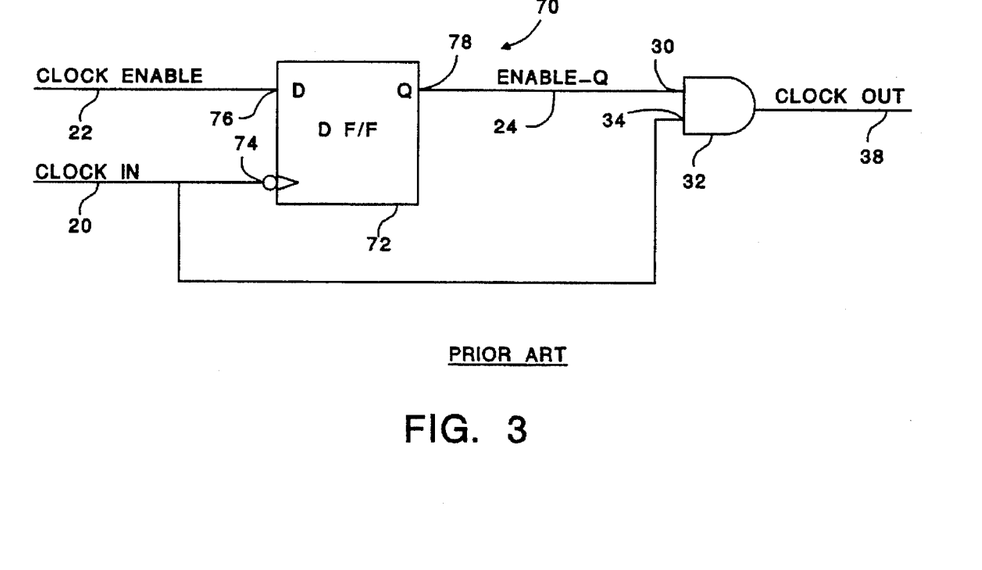
FIG. 3 illustrates a logic diagram of an alternative exemplary prior art clock circuit which eliminates the potential glitch on the clock output.
Figure 4:
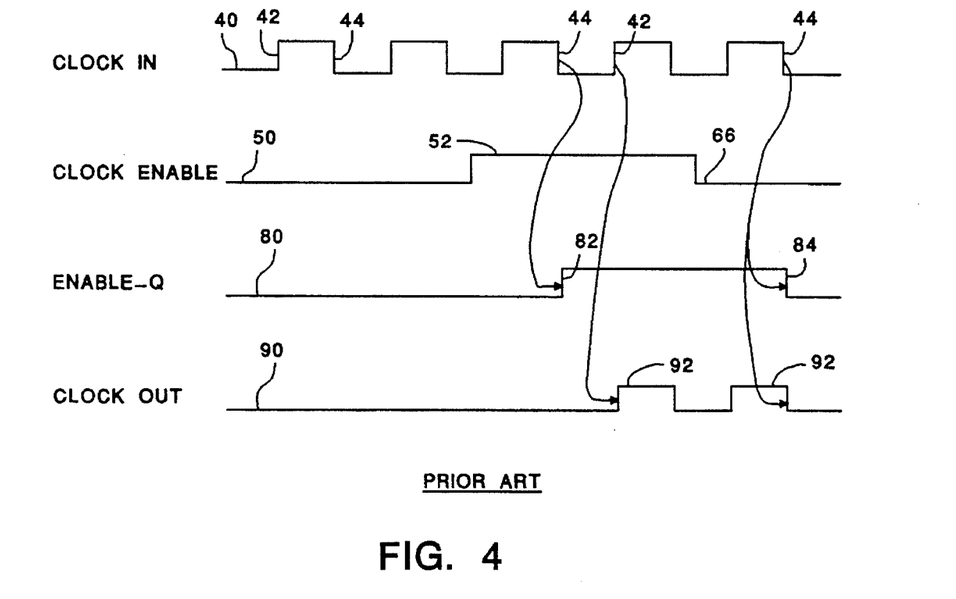
FIG. 4 illustrates timing diagrams of signals associated with the prior art clock enable circuit of FIG. 3.

FIG. 3 illustrates an alternative exemplary prior art circuit 70 which is a partial solution to the problems exemplified by the circuit 10 of FIG. 1. FIG. 4 illustrates timing diagrams for the circuit of FIG. 3. Like elements in FIG. 3 and FIG. 4 are numbered as in FIG. 1 and FIG. 2, respectively. As illustrated in FIG. 3, the D flip-flop 12 is replaced with a D flip-flop 72 having a falling edge triggered clock input (as indicated by a circle at the clock input), a D input 76 and a Q output 78. The D flip-flop 72 operates in a manner similar to the operation of the D flip-flop 12 of FIG. 1; however, the state of the CLOCK ENABLE signal on the data input 76 is transferred to the Q output 78 on the falling edges 44 of the CLOCK IN signal rather than on the rising edges 42. Thus, as illustrated by a timing diagram 80 in FIG. 4, the ENABLE_Q output will switch from low-to-high (illustrated by a rising edge 82) and from high-to-low (illustrated by a falling edge 84) after each falling edge of the CLOCK IN signal. The CLOCK OUT signal, illustrated by a timing diagram 90, will have output pulses 92 which occur when the CLOCK IN signal is high while the ENABLE_Q output is high. Because the ENABLE_Q signal switches on the falling edges 44 of the CLOCK IN signal, the CLOCK IN signal is always low when the switching of the ENABLE_Q signal has occurred. Thus, there is no possibility of the CLOCK OUT signal having glitches caused by the short concurrence of both signals being high.

Although the circuit 70 of FIG. 3 would appear to be a simple and straightforward solution to the clock enable circuit, it should be understood that current circuit design is done using circuit generation software which generates integrated circuits from logic equations and state information provided by a design engineer, or the like. Such circuit generation software performs minimization and optimization routines in laying out circuit paths within the integrated circuit. The routines are not entirely under the control of the design engineer. Although a design engineer may specify the circuit 70 illustrated in FIG. 3, the circuit generation software may produce a circuit similar to the circuit 10 of FIG. 1 having the problem described above. Thus, there remains a need for a glitch-free clock enable circuit which will produce predictable results regardless of minimization and optimization routines performed by the circuit generation software.

Figure 5:
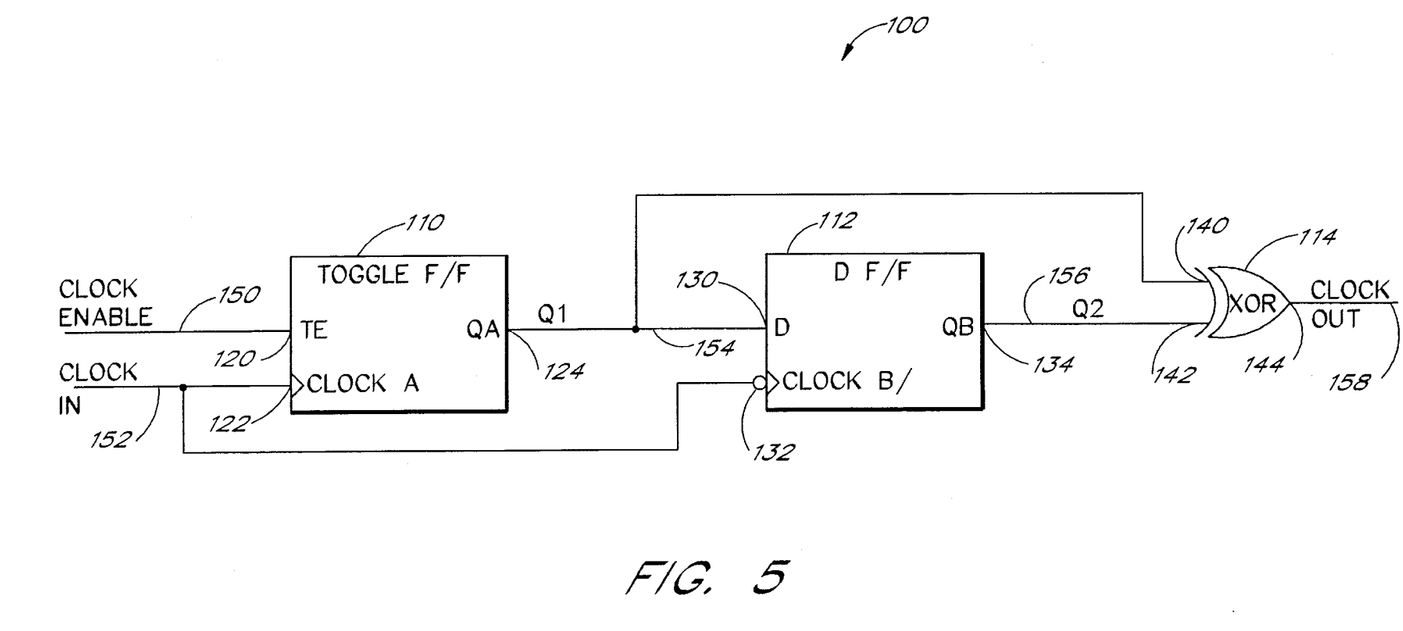
FIG. 5 illustrates a logic diagram of a first embodiment of the present invention which is responsive to a clock enable signal and a clock input signal to enable and disable a clock output signal.

FIG. 5 illustrates a logic diagram of a circuit 100 in accordance with the present invention which provides a clock output signal which can be enabled or disabled in a glitch-free manner. The structure of the circuit 100 is such that when the circuit paths for an integrated circuit are generated by circuit generation software, the resulting circuit 100 will operate in a predictable manner.

The circuit of 100 comprises a toggle flip-flop 110, a D flip-flop 112 and an exclusive-OR (XOR) gate 114. The two flip-flops and the XOR gate can be advantageously implemented with standardized integrated circuits such as, for example, 74-series (such as 74, 74L, 74LS, 74S, 74F, etc.) transistor—transistor logic (TTL) or 74C-series or 4000-series complementary metal-oxide-semiconductor (CMOS) logic to name a few. In the preferred implementation of the present invention, the flip-flops 110, 112 and XOR gate 114 are advantageously implemented in custom or semi-custom logic circuitry such as programmable array logic (PAL) or application specific integrated circuits (ASIC).

As illustrated in FIG. 5, the toggle flip-flop 110 has a toggle enable (TE) input 120, a clock (i.e., trigger or toggle) input (CLOCKA) 122 and a data output (QA) 124. The operation of the toggle flip-flop is well known in the art. For example, when the toggle enable signal on the TE input 120 is high, a rising edge of the signal on the CLOCKA input 122 causes the QA output 124 to change states (i.e., to toggle from a high state to a low state or to toggle from a low state to a high state). While the TE input 120 is high, each successive rising edge of the CLOCKA input 122 toggles the QA output 124. When the TE input 120 is low, the QA output 124 will not change state irrespective of logic state changes on CLOCKA input 122. The characteristic table for a toggle flip flop is shown below wherein $QA^t$ is the logic level of the QA output 124 prior to a rising edge of the CLOCKA input 122 and $QA^{t+1}$ is the logic level of the QA output 124 after a rising edge of the CLOCKA input 122.

| TE | $QA^t$ | $QA^{t+1}$ |
| --- | --- | --- |
| 0 | 0 | 0 |
| 0 | 1 | 1 |
| 1 | 0 | 1 |
| 1 | 1 | 0 |

An exemplary toggle flip-flop in accordance with the foregoing characteristic table will be described below in connection with FIG. 7.

The D flip-flop 112 has a data input (D) 130, a clock input (CLOCKB/) 132 and a data output (QB) 134. (The "/" at the end of "CLOCKB/" signifies that this is a negative-edge triggered flip-flop, i.e., the flip-flop is responsive to a falling edge of the CLOCKB/ input as explained below). The operation of the D flip-flop is also well known in the art. For example, when the D input 130 is high, a falling edge on the CLOCKB/ input 132 causes the QB output 134 to be in a high state, irrespective of the previous QB output state. When the D input 130 is low, a falling edge on the CLOCKB/ input 132 causes the QB output 134 to be in a low state, irrespective of the previous QB output state.

The XOR gate 114 has a first input 140, a second input 142 and an output 144. The operation of an XOR gate is also well known in the art. When the first input 140 and the second input 142 are at different logic states, the output 144 is at a high logic state. When the first input 140 and the second input 142 are at the same logic states (i.e., either both high or both low), the output 144 is at a low logic state.

The circuit 100 of FIG. 5 has a CLOCK IN input signal 152 which is provided as the CLOCKA input 122 of the toggle flip-flop 110 and as the CLOCKB/ input 132 of the D flip-flop 112. The circuit 100 also has a CLOCK ENABLE input signal 150 which is provided as the TE input 120 of the toggle flip-flop 110. The QA output 124 of the toggle flip-flop 110 generates a Q1 signal 154 which is provided as the D input 130 of the D flip-flop 112 and as the first input 140 of the XOR gate 114. The QB output 134 of the D flip-flop 112 generates a Q2 signal 156 at the second input 142 of the XOR gate 114. The circuit 100 generates a CLOCK OUT output signal 158 at the output 144 of the XOR gate 114.

Figure 6:
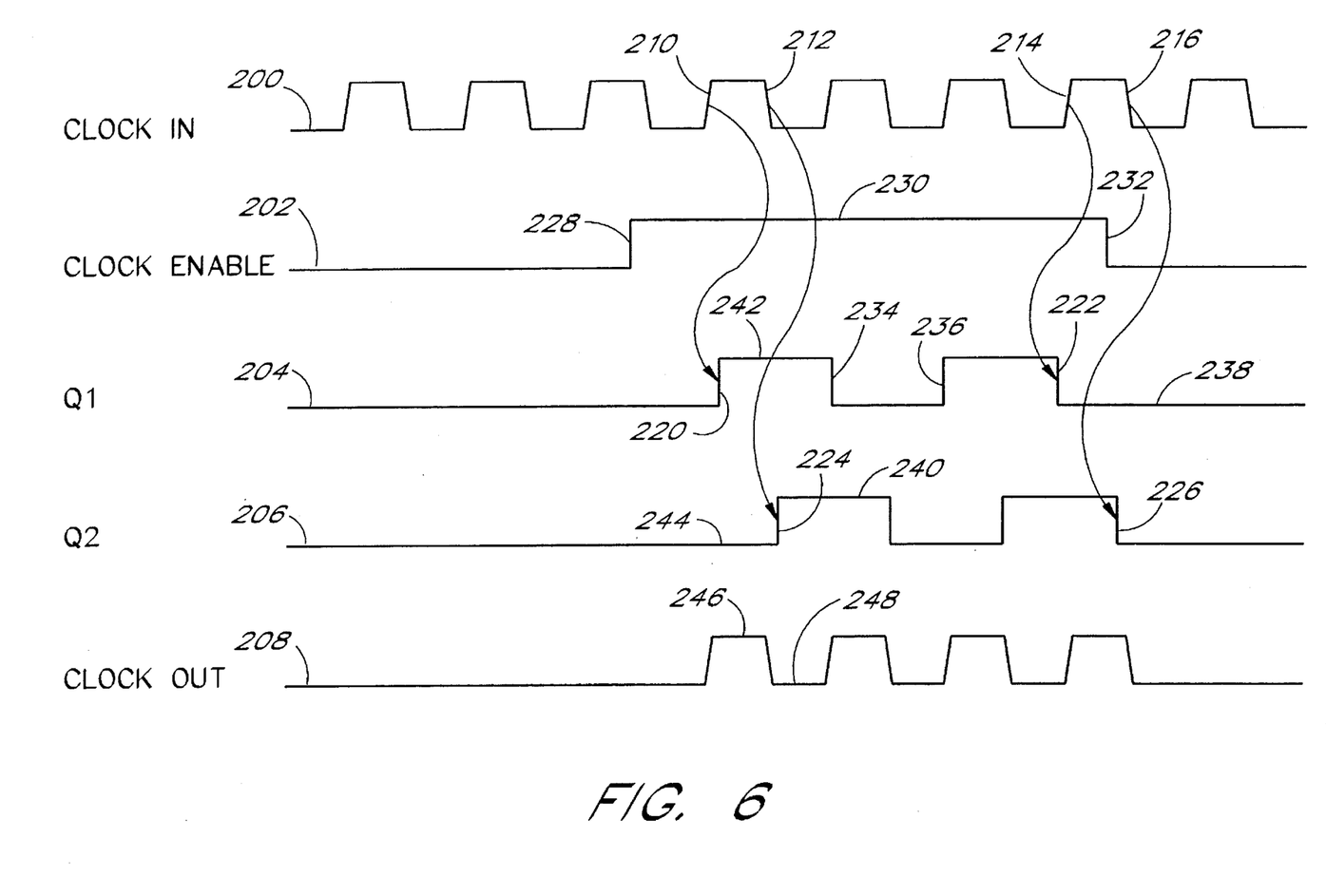
FIG. 6 illustrates timing diagrams of signals associated with the embodiment of FIG. 5, showing the relationship between the input signals and the output signal.

The operation of the circuit 100 is illustrated in FIG. 6 by a CLOCK IN timing diagram 200 that represents the CLOCK IN input signal 152, a CLOCK ENABLE timing diagram 202 that represents the CLOCK ENABLE input signal 150, a Q1 timing diagram 204 that represents the Q1 signal 154, a Q2 timing diagram 206 that represents the Q2 signal 156, and a CLOCK OUT timing diagram 208 that represents the CLOCK OUT output signal 158.

As illustrated by the timing diagrams 200, 204 and 206, the CLOCK IN input signal 152 is a pulse train having low-to-high transitions (for example, transitions 210 and 214) and high-to-low transitions (for example, transitions 212 and 216). The QA output 124 of the toggle flip-flop 110 and hence the Q1 signal 154 change state only on the CLOCK IN input signal low-to-high transitions (as illustrated, for example, by transitions 220 and 222 of the Q1 timing diagram 204). The QB output 134 of the D flip-flop 112 and hence the Q2 signal 156 change state only on the CLOCK IN input signal high-to-low transitions (as illustrated, for example, by transitions 224 and 226 of the Q2 timing diagram 206).

As shown in the timing diagrams 200, 202 and 204, if a low-to-high transition (illustrated by transition 228 of timing diagram 202) on the CLOCK ENABLE input signal 150 occurs sufficiently before a low-to-high transition 210 of the CLOCK IN input signal 152 such that the minimum setup time of the toggle flip-flop 110 is satisfied, then the high state (illustrated by a logic level 230 of timing diagram 202) of the CLOCK ENABLE input signal 150 enables the toggle flip-flop 110 to respond to the low-to-high transition (illustrated by transition 210 of timing diagram 200) of the CLOCK IN input signal 152 and the toggle flip-flop QA output 124 and hence the Q1 signal 154 changes logic states (as illustrated by the transition 220 of the Q1 timing diagram 204). As long as the CLOCK ENABLE input signal 150 remains in a high state, the toggle flip-flop QA output 124 and hence the Q1 signal 154 continues to change logic states on each low-to-high transition of the CLOCK IN input signal 152 (as illustrated by transitions 234, 236 and 222 of the timing diagram 204). After a high-to-low transition (illustrated by a transition 232 of the timing diagram 202) of the CLOCK ENABLE input signal 150, the Q1 signal 154 remains at its current logic state (illustrated by a logic level 238 of timing diagram 204).

As shown in timing diagrams 200, 204 and 206, the Q2 signal 156 is a half-cycle delayed version of the Q1 signal 154. When a high-to-low transition (illustrated by the transition 212 of timing diagram 200) occurs on the CLOCK IN input signal 152, the D flip-flop QB output 134 and hence the Q2 signal 156 acquires a logic state (illustrated by a logic level 240 of the timing diagram 206) which is equal to the current logic state (illustrated by a logic level 242 of timing diagram 204) of the Q1 signal 154.

As shown in timing diagrams 200 through 208, the CLOCK OUT output signal 158 is an enabled/disabled version of the CLOCK IN input signal 152, as controlled by the CLOCK ENABLE input signal 150. The Q1 signal 154 is XOR'd with the Q2 signal 156 such that when the Q1 signal logic state (illustrated by the logic level 242 of the timing diagram 204) is different than the Q2 signal logic state (illustrated by a logic level 244 of the timing diagram 206), the CLOCK OUT signal logic state is high (illustrated by a logic level 246 of the timing diagram 208). When the Q1 signal logic state (illustrated by the logic level 242 of the timing diagram 204) is the same as the Q2 signal logic state (illustrated by the logic level 240 of timing diagram 206), the CLOCK OUT signal logic state is low (illustrated by a logic level 248 of the timing diagram 208). Thus the CLOCK OUT signal pulses occur only during the period of time that the CLOCK ENABLE input signal 150 is in a high logic state (illustrated by the logic level 230 of timing diagram 202) coincidentally with the low-to-high transitions (illustrated by the transitions 210 and 214 of the timing diagram 200) of the CLOCK IN signal 152.

Figure 7:
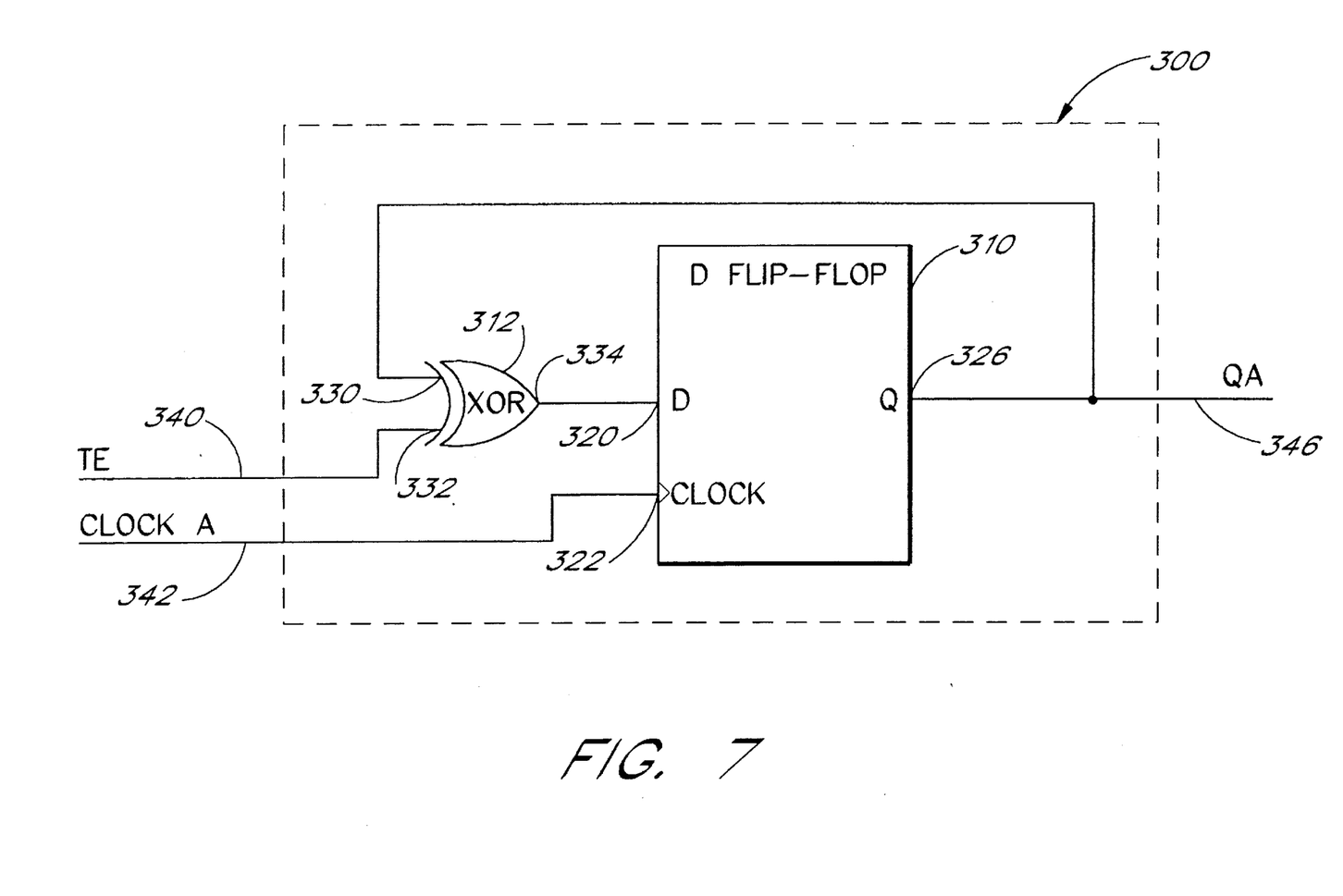
FIG. 7 illustrates an embodiment of a toggle flip-flop which can be incorporated into the embodiments of the present invention.

FIG. 7 illustrates a logic diagram of a circuit 300 that is an implementation of the toggle flip-flop 110. The circuit comprises a positive-edge-triggered D flip-flop 310 and an XOR gate 312. As illustrated, the flip-flop 310 has a data input (D) 320, a CLOCK (i.e., toggle or trigger) input 322, and a high active data output (Q) 326. The XOR gate 312 has a first input 330, a second input 332 and an output 334 and operates as previously described. ATE input signal 340 is provided to the second input 332 of the XOR gate 312. A CLOCKA signal 342 is provided to the CLOCK input 322 of the D flip-flop 310. The QA signal 346 is generated from the Q output 326 of the D flip-flop 310. The Q output 326 is further provided to the first input 330 of the XOR gate 312. The XOR gate output 334 is connected to the D input 320 of the flip-flop 310.

While the TE input signal 340 is at a low state, the output of the XOR gate 334 will be at the same logic state as the Q output signal 326 on the first input 330 of the XOR gate 312. Thus, the current state of the Q output 326 is constantly loaded into the flip-flop 310 on each transition of the CLOCKA signal 342. On the other hand, when the TE input 340 is high, the XOR gate 312 operates to invert the Q output signal 326 applied to its first input 330. Thus, the Q output signal 326 toggles on each occurrence of the CLOCKA signal 342.

It should be understood that by using the two flip-flops 110 and 112, the circuit generation software will be constrained to connect the circuit 100 as illustrated because known circuit minimization and optimization routines do not combine the functions of such clocked flip-flops. Thus, the circuit 100 in the integrated circuit generated will operate in a predictable manner to produce the glitch-free CLOCK OUT signal 158.

While preferred embodiments of this invention have been disclosed herein, those skilled in the art will appreciate that changes and modifications may be made therein without departing from the spirit and scope of the invention as defined in the appended claims.

What is claimed is:

1. A circuit which receives an input clock signal having first and second logic states and an input clock enable signal having an enable state and a disable state and which generates an output clock signal responsive to said input clock enable signal, said circuit comprising:

a toggle flip-flop having an enable input connected to said input clock enable signal, a first clock input connected to said input clock signal, and a first output having first and second logic states, said first output changing logic states upon occurrence of both a change from said first logic sate to said second logic state at said first clock input and when said input clock enable signal has said enable state;

a D flip-flop having a data input connected to said first output, a second clock input connected to said input clock signal and a second output, said second output changing to the state of said data input upon occurrence of a change from said second logic state to said first logic state at said second clock input; and a combinatorial logic circuit having a plurality of inputs comprising said first output and said second output, said combinatorial logic responsive to said first output and said second output to generate said output clock signal, said output clock signal having a first logic state when said first output and said second output have a same logic state and said output clock signal having a second logic state when said first output and said second output have a different logic states.

2. The circuit of claim 1, wherein said combinatorial logic circuit is an exclusive-OR gate.

3. A method for providing a glitch free clock signal, said method comprising the steps of:

applying a first clock signal having first and second logic states to a clock input of a toggle flip-flop;

selectively enabling said toggle flip-flop with an enable signal having an enable state and a disable state;

generating a toggle output signal having first and second logic states from said toggle flip-flop, said toggle output signal responsive to said first clock signal and said enable signal, said toggle output signal changing logic states on each occurrence of a change of said first clock signal from said first logic state to said second logic state when said enable signal has said enable state, said toggle output signal maintaining a current state when said enable signal has said disable state;

applying said toggle output signal to a data input of a D flip-flop;

applying said first clock signal to a clock input of said D flip-flop;

generating a D flip-flop output signal from said D flip-flop, said D flip-flop output signal responsive to both said first clock signal and said toggle output, said D flip-flop output signal changing to the logic state of said toggle output signal when said first clock signal changes from said second logic state to said first logic state; and applying said toggle output signal and said D flip-flop output signal to respective first and second inputs of a combinatorial logic circuit, said combinatorial logic circuit generating an output clock signal responsive to said first and second inputs, said output clock signal having a first logic state when said first input and said second input have a same logic state and said output clock signal having a second logic state when said first input and second input have different logic states.

* * * * *

UNITED STATES PATENT AND TRADEMARK OFFICE
CERTIFICATE OF CORRECTION

PATENT NO. : 5,537,062

DATED : July 16, 1996

INVENTOR(S) : L. Randall Mote

It is certified that error appears in the above-indentified patent and that said Letters Patent is hereby corrected as shown below:

In claim 1, at column 6, line 48, change "sate" to --state--

Signed and Sealed this

Twenty-third Day of November, 1999

*Attest:*

Q. TODD DICKINSON

*Attesting Officer*   *Acting Commissioner of Patents and Trademarks*